(12) United States Patent
Cho et al.

(10) Patent No.: US 7,300,852 B2
(45) Date of Patent: Nov. 27, 2007

(54) METHOD FOR MANUFACTURING CAPACITOR OF SEMICONDUCTOR ELEMENT

(75) Inventors: Ho Jin Cho, Gyunggi-Do (KR); Jun Soo Chang, Gyunggi-Do (KR); Eun A. Lee, Seoul (KR); Su Jin Chae, Icheon-Si (KR); Young Dae Kim, Gyunggi-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/089,122

(22) Filed: Mar. 24, 2005

(65) Prior Publication Data

US 2006/0134856 A1    Jun. 22, 2006

(30) Foreign Application Priority Data

Dec. 16, 2004   (KR) ................. 10-2004-0107372

(51) Int. Cl.
*H01L 21/20* (2006.01)
(52) U.S. Cl. .................. 438/393; 257/E21.35
(58) Field of Classification Search ........... 438/240, 438/280, 293
See application file for complete search history.

(56) References Cited

U.S. PATENT DOCUMENTS

| | | | |
|---|---|---|---|
| 6,355,519 B1 * | 3/2002 | Lee | ............... 438/250 |
| 6,541,330 B1 | 4/2003 | Lee et al. | |
| 6,569,728 B2 * | 5/2003 | Lee et al. | ............... 438/210 |
| 6,583,021 B2 * | 6/2003 | Song | ............... 438/396 |
| 6,740,553 B1 | 5/2004 | Lee et al. | |
| 6,808,979 B1 * | 10/2004 | Lin et al. | ............... 438/242 |

FOREIGN PATENT DOCUMENTS

KR    2002-0096129    12/2002

\* cited by examiner

*Primary Examiner*—Scott B. Geyer
*Assistant Examiner*—Elias Ullah
(74) *Attorney, Agent, or Firm*—Marshall, Gerstein & Borun LLP (57) ABSTRACT

A method for manufacturing a capacitor of a semiconductor element including: forming a bottom electrode of the capacitor on a semiconductor substrate; performing rapid thermal nitrification (RTN) on the upper surface of the bottom electrode; performing a thermal process on the obtained structure having the bottom electrode in a furnace under a nitride atmosphere to eliminate stress generated by the RTN; forming $Al_2O_3$ and $HfO_2$ dielectric films on the nitrified bottom electrode; and forming a plate electrode of the capacitor on the $Al_2O_3$ and $HfO_2$ dielectric films. The thermal process is performed after the RTN performed on the surface of the bottom electrode, so that stress, generated from the RTN, is alleviated, thereby allowing the capacitor to obtain a high capacitance and lowering leakage current.

15 Claims, 6 Drawing Sheets

Fig. 1

(PRIOR ART)

METHOD FOR MANUFACTURING CAPACITOR OF SEMICONDUCTOR ELEMENT

BACKGROUND OF THE INVENTION

1. Field of the Invention

The present invention relates to a method for manufacturing a capacitor of a semiconductor element, and more particularly to a method for manufacturing a capacitor of a semiconductor element, which achieves a high capacitance using dielectric films made of $Al_2O_3$ and $HfO_2$ having a high dielectric constant.

2. Description of the Related Art

In order to achieve high-integration of a semiconductor element, methods for decreasing the dimensions of cells and lowering operating voltage have been researched and developed. Further, as a semiconductor element becomes increasingly integrated, the dimensions of a capacitor rapidly decrease, but an electric charge required for operating a memory element, i.e., capacitance per unit area, must be increased.

In order to assure sufficient capacitance of the capacitor, research into thinning a dielectric film, developing the structure for increasing the effective surface area of a capacitor electrode, and using a high dielectric material, such as $Ta_2O_5$, $BST(BaSrTiO_3)$, and $Al_2O_3$, in substitute for an nitride-oxide (NO) or an oxide-nitride-oxide (ONO) structure, as a dielectric film serving as an oxide film, are currently underway.

In order to reduce the increase of leakage current generated when the thickness of a dielectric film of the capacitor, the dielectric film does not use a single film, but uses a film containing several materials having a high dielectric constant. For example, a film made of $Ta_2O_5/TiO_2$, $Al_2O_3/TiO_2$, $Al_2O_3/HfO_2$, $Al_2O_3/ZrO_2$, $Ta_2O_5/HfO_2$, and $Ta_2O_5/ZrO_2$ is used as the dielectric film. Particularly, a composite dielectric film, having a double-layered or multi-layered structure, containing $Al_2O_3$, which has a low dielectric constant of 10 but a high leakage current prevention effect, and $HfO_2$, which has a high dielectric constant of 20~25 and high leakage current prevention effect due to a high band gap, has been developed and researched.

Figure 1:
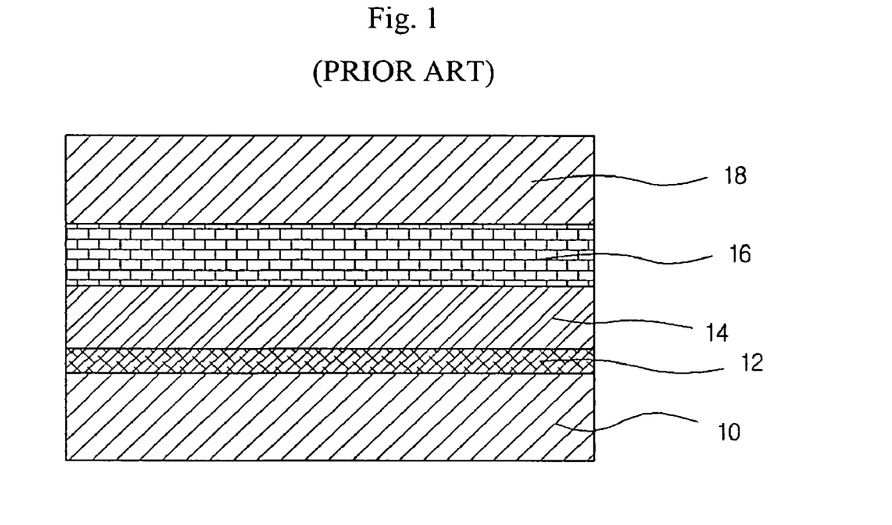
FIG. 1 is a schematic longitudinal sectional view of a conventional capacitor having $Al_2O_3$ and $HfO_2$ dielectric films of a semiconductor element.

FIG. 1 is a schematic longitudinal sectional view of a conventional capacitor having $Al_2O_3$ and $HfO_2$ dielectric films of a semiconductor element.

With reference to FIG. 1, the conventional capacitor having $Al_2O_3$ and $HfO_2$ dielectric films has a silicon insulator silicon (SIS) structure, and comprises a bottom electrode 10, made of doped polysilicon, formed under a semiconductor substrate, and an $Al_2O_3$ dielectric film 14 and an $HfO_2$ dielectric film 16, which serve as a composite dielectric film, sequentially formed on the bottom electrode 10. The conventional capacitor further comprises a plate electrode 18, made of doped polysilicon, formed on the $Al_2O_3$ and $HfO_2$ dielectric films 14 and 16. Here, a $Si_3N_4$ film 12 is formed between the bottom electrode 10 and the $Al_2O_3$ and $HfO_2$ dielectric films 14 and 16.

In order to prevent the generation of a natural oxide film between the bottom electrode 10 and the $Al_2O_3$ film 14 of the conventional capacitor, a rapid thermal nitrification (RTN) process is performed. Thereafter, nitrification for reducing a thermal budget of the plate electrode 18 to prevent the plate electrode 18 from reacting with $HfO_2$ is performed.

When the total thickness of the $Al_2O_3$ and $HfO_2$ dielectric films 14 and 16 is decreased to approximately 25 Å by the above nitrification, leakage current is also lowered. Accordingly, the capacitor having $Al_2O_3$ and $HfO_2$ dielectric films has a capacitance higher than that of a capacitor having an $Al_2O_3$ dielectric film.

However, in the case that the RTN (for example, at a temperature of 800~900° C.) is performed on the surface of the bottom electrode, stress is applied to a gate electrode of a semiconductor substrate, and then edge of an isolation film. When a capacitor is manufactured by forming $Al_2O_3$ and $HfO_2$ dielectric films on the semiconductor element, to which the above stress is applied, the manufactured capacitor has a desired high capacitance, but is disadvantageous in that the force needed for driving a transistor, such as refresh, is deteriorated.

SUMMARY OF THE INVENTION

Therefore, the present invention has been made in view of the above problems, and it is an object of the present invention to provide a method for manufacturing a capacitor having $Al_2O_3$ and $HfO_2$ dielectric films of a semiconductor element, in which RTN is performed on the surface of a bottom electrode, and a rapid thermal process is performed in a furnace so that stress, applied to a semiconductor substrate by the RTN, is alleviated, thereby obtaining a high capacitance and improved driving capacity.

In accordance with the present invention, the above and other objects can be accomplished by the provision of a method for manufacturing a capacitor of a semiconductor element comprising: forming a bottom electrode of the capacitor on a semiconductor substrate; performing rapid thermal nitrification (RTN) on the upper surface of the bottom electrode; performing a thermal process on the obtained structure having the nitrified bottom electrode in a furnace under a nitride atmosphere to eliminate stress generated by the RTN; forming $Al_2O_3$ and $HfO_2$ dielectric films on the nitrified bottom electrode; and forming a plate electrode of the capacitor on the $Al_2O_3$ and $HfO_2$ dielectric films.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings so that those skilled in the art will appreciate the subject matter of the present invention.

In order to precisely illustrate several layers and regions in the drawings, thicknesses thereof are enlarged. In the following description of the present invention, the same or similar elements are denoted by the same reference numerals FIGS. 2A to 2E are longitudinal sectional views sequentially illustrating a process for manufacturing a capacitor having $Al_2O_3$ and $HfO_2$ dielectric films of a semiconductor element in accordance with one embodiment of the present invention. With reference to FIGS. 2A to 2E, the capacitor in accordance with one embodiment of the present invention has a silicon insulator silicon (SIS) structure.

Figure 2A:
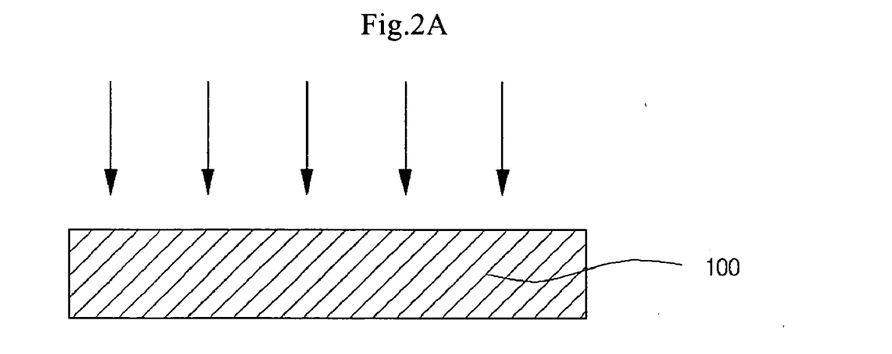
FIGS. 2A to 2E are longitudinal sectional views sequentially illustrating a process for manufacturing a capacitor having $Al_2O_3$ and $HfO_2$ dielectric films of a semiconductor element in accordance with one embodiment of the present invention.

As shown in FIG. 2A, a bottom electrode 100 is formed on a semiconductor substrate. Here, the bottom electrode 100 is connected to a structure of the semiconductor substrate having an MOS transistor (not shown) including a gate electrode and source/drain junction regions such that the bottom electrode 100 is perpendicular to the junction regions. For example, the bottom electrode 100 is formed by depositing a doped polysilicon layer on the semiconductor substrate by chemical vapor deposition (CVD), and, in order to compensate for the insufficient dopant density of the bottom electrode 10, a dopant, such as $PH_3$, is implanted into the bottom electrode 100 in a furnace or by plasma ion implantation.

Here, the bottom electrode 100 may have a three-dimensional structure selected from the group consisting of stack, trench, cylinder, fin, and stack cylinder.

A natural oxide film and contaminants are removed from the surface of the bottom electrode 100 by a cleaning step using a cleaning solution, such as HF or BOE. Then, a $SiO_2$ thin film having a thickness of 0.3 nm~1.5 nm is formed on the surface of the bottom electrode 100 using a cleaning solution having a composition ratio of $NH_4OH:H_2O_2:H_2O=1:4~5:20~50$.

Figure 2B:
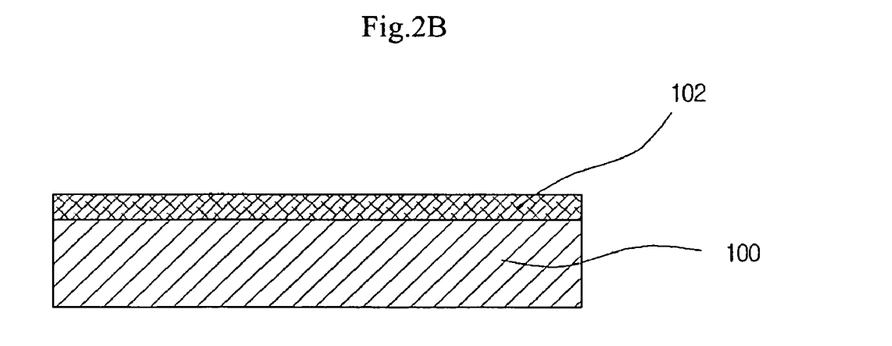

Thereafter, as shown in FIG. 2B, in order to prevent the formation of a natural oxide film on an interface between the upper surface of the bottom electrode 100 and $Al_2O_3$ and $HfO_2$ dielectric films, the upper surface of the bottom electrode 100 is nitrified by the RTN, thus having a SiN film 102 formed thereon. Here, the RTN is performed at a temperature of 800~900° C. for 30~120 seconds.

Figure 2C:
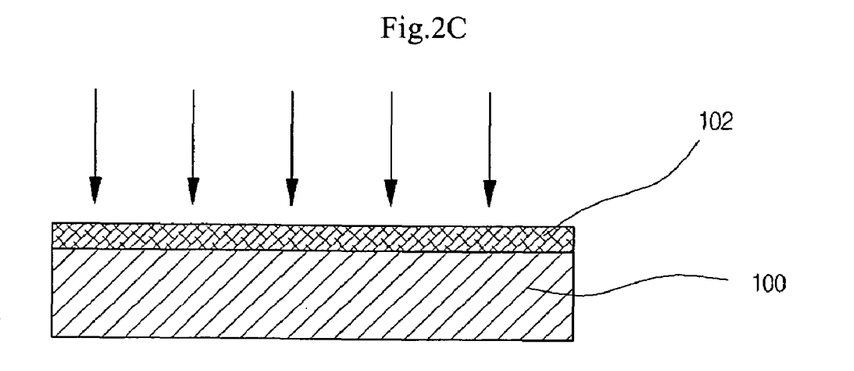

Sequentially, as shown in FIG. 2C, the structure including the bottom electrode 100 having the SiN film 102 is thermally treated in a furnace under a nitride atmosphere so that stress, applied to a gate electrode of the semiconductor substrate and the edge of an isolation film by the RTN, is alleviated. Here, the thermal process is performed in the furnace having an internal temperature under 700~800° C. under a $N_2$ or $NH_3$ atmosphere for 10~60 seconds.

Figure 2D:
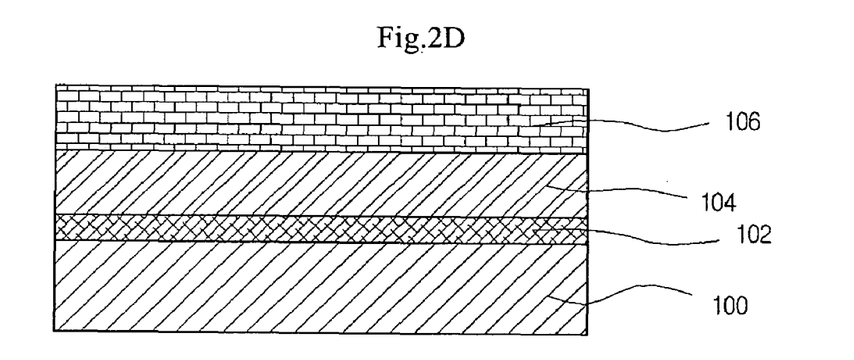

Thereafter, as shown in FIG. 2D, $Al_2O_3$ and $HfO_2$ dielectric films 104 and 106, serving as a composite dielectric film, are formed on the upper surface of the bottom electrode 100 having the SiN film 102. Here, the $Al_2O_3$ dielectric film 104 has a thickness of 15~35 Å, and the $HfO_2$ dielectric film 106 has a thickness of 10~30 Å. The $Al_2O_3$ and $HfO_2$ dielectric films 104 and 106 are formed by atomic layer deposition (ALD) at a temperature of 200~480° C. Here, TMA is used as an Al source, $Hf[N(CH_3)_2]_4$, $Hf[N(CH_2CH_3)_2]_4$, or $Hf[N(CH_2CH_3)(CH_3)]_4$ is used as an Hf source, and $O_3$ or $HfO_2$ is used as an $O_2$ source.

Then, the $Al_2O_3$ and $HfO_2$ dielectric films 104 and 106 are thermally treated in the furnace at a temperature of 550~700° C. under an $N_2$ atmosphere so that the composite dielectric film is crystallized, nitride content of the composite dielectric film is increased, and carbon impurities are removed from the composite dielectric film.

Figure 2E:
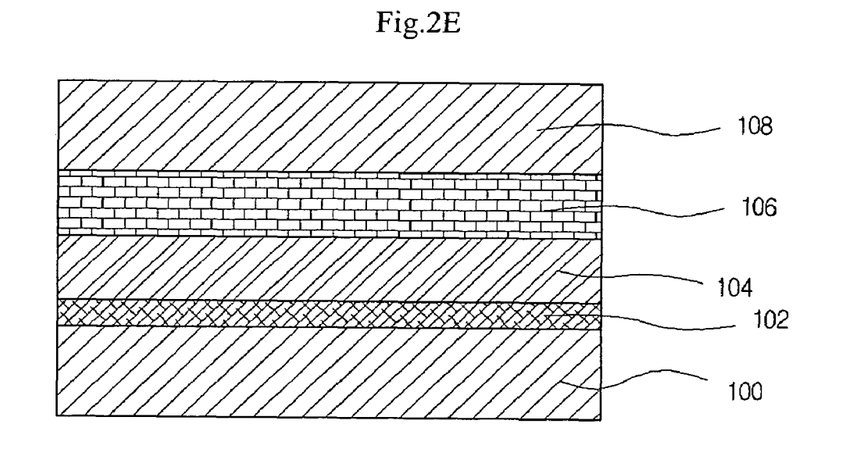

Thereafter, as shown in FIG. 2E, a plate electrode 108 is formed on the $Al_2O_3$ and $HfO_2$ dielectric films 104 and 106. In the case that the capacitor of the present invention has an SIS structure, the plate electrode 108 is made of one selected from the group consisting of doped polysilicon, doped polysilicon and a metal film, and silicon germanium (SiGe) and a metal film. Here, doped polysilicon and silicon germanium (SiGe) is deposited by CVD, and the metal film is deposed by physical vapor deposition (PVD) such as sputtering. The metal film is made of one selected from the group consisting of TiN, TaN, W, WN, WSi, Ru, $RuO_2$, Ir, $IrO_2$, and Pt. In the case that the plate electrode 108 is made of doped polysilicon, a rapid thermal process (RTP) for activating a dopant is performed, and then a thermal process in the furnace for maintaining characteristics of the capacitor is performed at a temperature of less than 600° C.

FIGS. 3A to 3G are longitudinal sectional views sequentially illustrating a process for manufacturing a capacitor having $Al_2O_3$ and $HfO_2$ dielectric films of a semiconductor element in accordance with another embodiment of the present invention. With reference to FIGS. 3A to 3G, the capacitor in accordance with another embodiment of the present invention has a silicon insulator silicon (SIS) structure, and comprises a bottom electrode having a meta-stable polysilicon (MSP) structure.

Figure 3A:
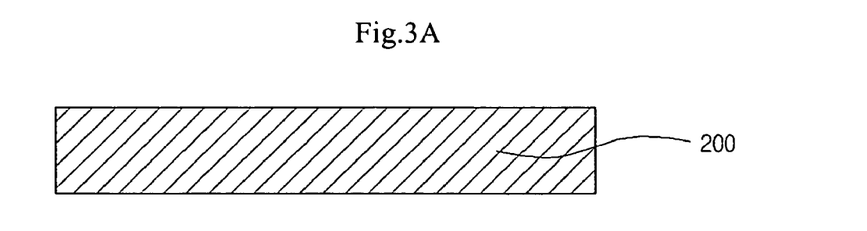
FIGS. 3A to 3G are longitudinal sectional views sequentially illustrating a process for manufacturing a capacitor having $Al_2O_3$ and $HfO_2$ dielectric films of a semiconductor element in accordance with another embodiment of the present invention.

As shown in FIG. 3A, a bottom electrode 200 having the MSP structure is formed on a semiconductor substrate. Here, by depositing a low-doped or undoped amorphous silicon layer or polysilicon layer, seeding the deposited silicon using $Si_2H_6$ gas, and performing an annealing process in a high vacuum state, an irregular silicon thin film 202 is formed on the bottom electrode 200 due to the mobility of silicon atoms.

Figure 3B:
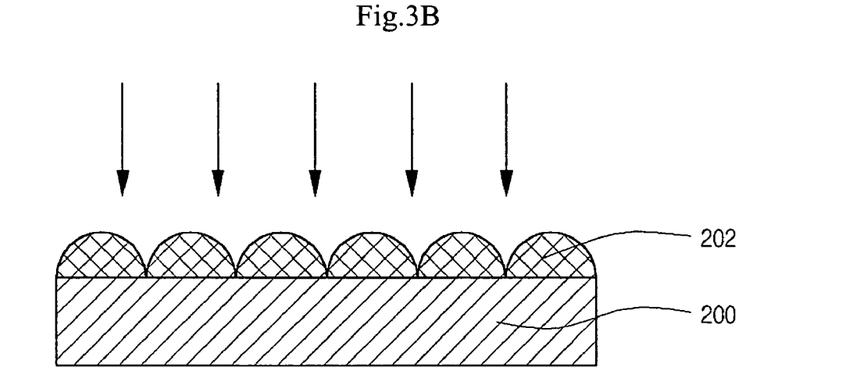

Then, as shown in FIG. 3B, in order to compensate for the insufficient dopant density of the bottom electrode 200 having the irregular silicon thin film 202 formed thereon, a dopant, such as $PH_3$, is implanted into the bottom electrode 200 in a furnace or by plasma ion implantation.

Thereafter, a natural oxide film and contaminants are removed from the surface of the bottom electrode 200 having the irregular silicon thin film 202 formed thereon by a cleaning step using a cleaning solution, such as HF or BOE, and a $SiO_2$ thin film (not shown) having a thickness of 0.3 nm~1.5 nm is formed on the surface of the bottom electrode 200 having the irregular silicon thin film (not shown) formed thereon using a cleaning solution having a composition ratio of $NH_4OH:H_2O_2:H_2O=1:4~5:20~50$.

The RTP is performed on the obtained result having the $SiO_2$ thin film, thereby activating P of the implant dopant.

Figure 3C:
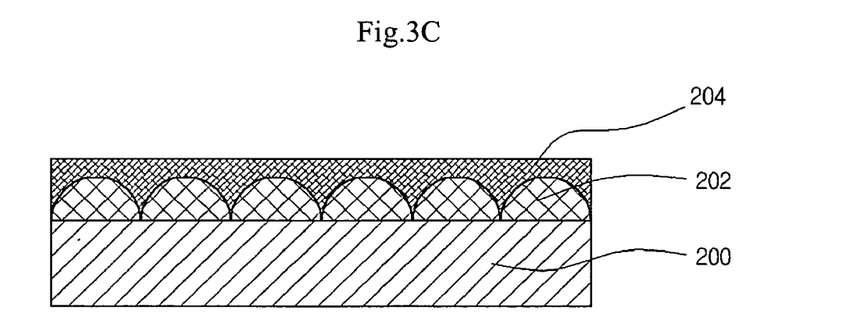

Thereafter, as shown in FIG. 3C, in order to prevent the formation of a natural oxide film on an interface between the upper surface of the bottom electrode 200 having the irregular silicon thin film 202 formed thereon and $Al_2O_3$ and $HfO_2$ dielectric films, the upper surface of the bottom electrode 200 is nitrified by the RTN, thus having a SiN film 204 formed thereon. Here, the RTN is performed at a temperature of 800~900° C. for 30~120 seconds.

Figure 3D:
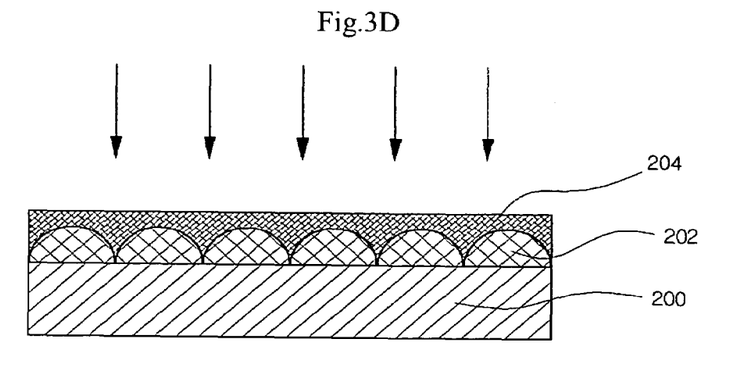

Sequentially, as shown in FIG. 3D, the structure including the nitrified bottom electrode 200 having the irregular silicon thin film 202 and the SiN film 204 is thermally treated in a furnace under a nitride atmosphere so that stress, applied to a gate electrode of the semiconductor substrate and an edge of an isolation film by the RTN, is alleviated. Here, the thermal process is performed in the furnace having an internal temperature of 700~800° C. under a $N_2$ or $NH_3$ atmosphere for 10~60 seconds.

Figure 3E:
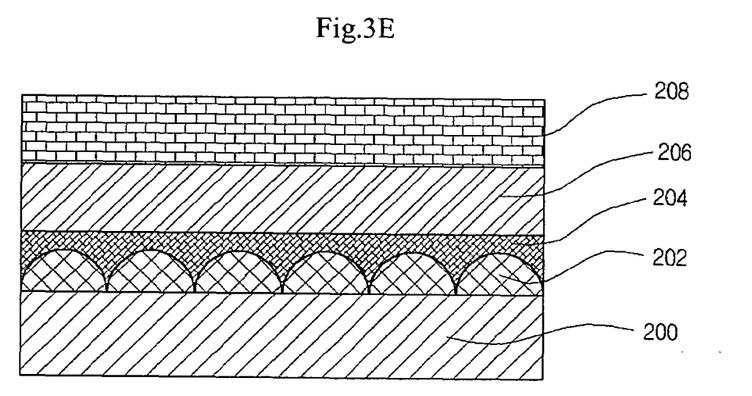

Thereafter, as shown in FIG. 3E, $Al_2O_3$ and $HfO_2$ dielectric films 206 and 208, serving as a composite dielectric film, are formed on the upper surface of the nitrified bottom electrode 200 having the irregular silicon thin film 202 and the SiN film 204. Here, the $Al_2O_3$ dielectric film 206 has a thickness of 15~35 Å, and the $HfO_2$ dielectric film 208 has a thickness of 10~30 Å. The $Al_2O_3$ and $HfO_2$ dielectric films 206 and 208 are formed by atomic layer deposition (ALD) at a temperature of 200~480° C. Here, TMA is used as an Al source, $Hf[N(CH_3)_2]_4$, $Hf[N(CH_2CH_3)_2]_4$, or $Hf[N(CH_2CH_3)(CH_3)]_4$ is used as an Hf source, and $O_3$ or $HfO_2$ is used as an $O_2$ source.

Figure 3F:
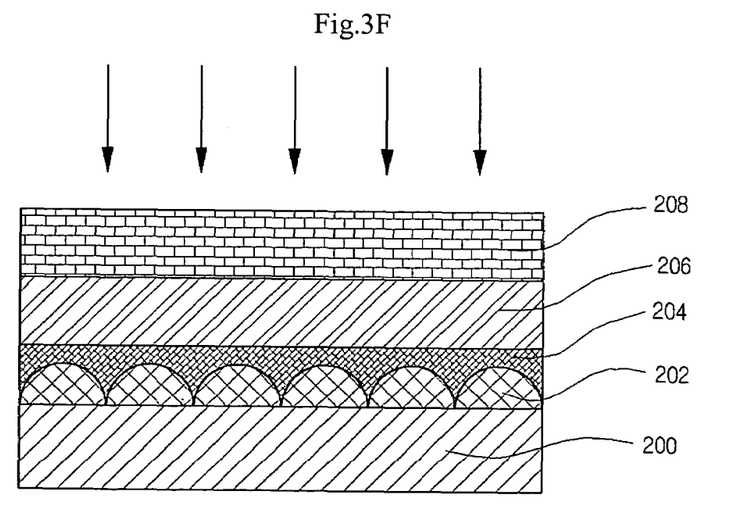

Then, as shown in FIG. 3F, the $Al_2O_3$ and $HfO_2$ dielectric films 206 and 208 are thermally treated in a furnace at a temperature of 550~700° C. under an $N_2$ atmosphere so that the composite dielectric film is crystallized, nitride content of the composite dielectric film is increased, and carbon impurities are removed from the composite dielectric film.

Figure 3G:
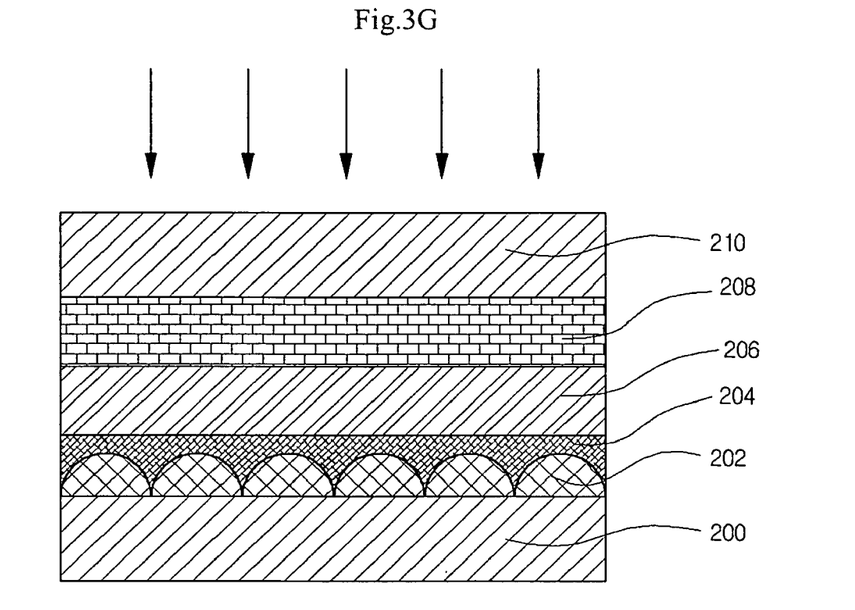

Thereafter, as shown in FIG. 3G, a plate electrode 210 is formed on the $Al_2O_3$ and $HfO_2$ dielectric films 206 and 208. The plate electrode 210 is made of one selected from the group consisting of doped polysilicon, doped polysilicon and a metal film, and silicon germanium (SiGe) and a metal film. Here, doped polysilicon and silicon germanium (SiGe) are deposited by CVD, and the metal film is deposited by physical vapor deposition (PVD) such as sputtering. The metal film is made of one selected from the group consisting of TiN, TaN, W, WN, WSi, Ru, $RuO_2$, Ir, $IrO_2$, and Pt. In the case that the plate electrode 210 is made of doped polysilicon, a rapid thermal process (RTP) for activating a dopant is performed, and a thermal process in the furnace for maintaining characteristics of the capacitor is performed at a temperature of less than 600° C.

Figure 4A:
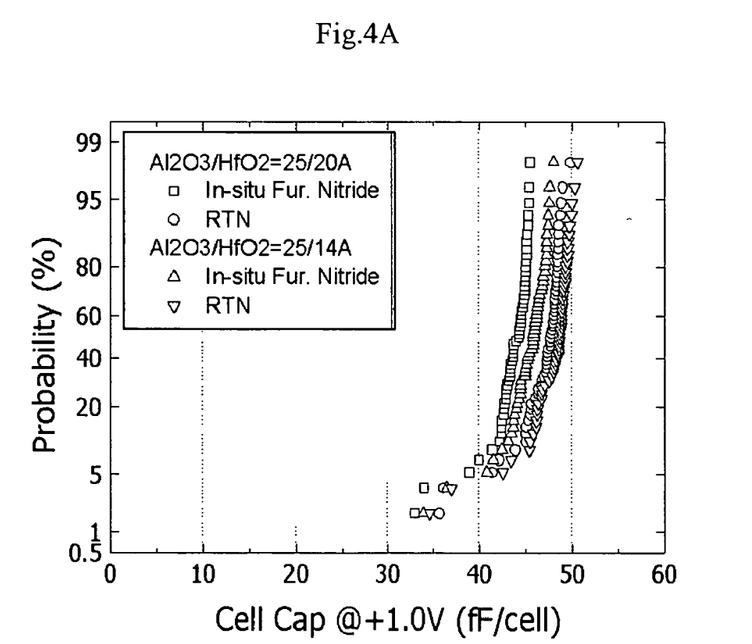
FIGS. 4A and 4B are graphs comparing probabilities (%) of leakage current of the conventional capacitor and the capacitor manufactured by the method of the present invention.
Figure 4B:
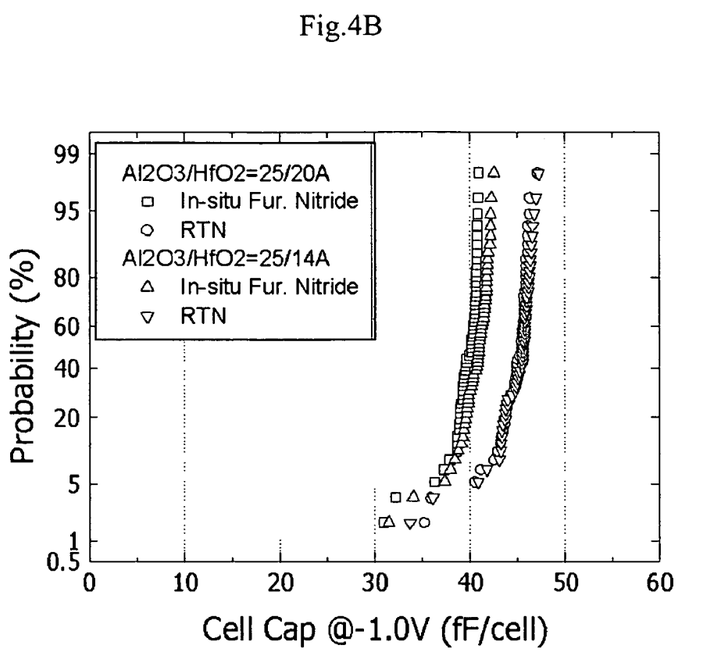

FIGS. 4A and 4B are graphs comparing probabilities (%) of leakage current of the conventional capacitor and the capacitor manufactured by the method of the present invention.

With reference to FIGS. 4A and 4B, when $Al_2O_3/HfO_2$ dielectric films respectively have thicknesses of 25 Å/20 Å and 25 Å/14 Å and feed powers of cell capacitors are respectively +1.0V and −1.0V, the probabilities (%) of leakage current in the capacitors (expressed by ○ and ▽) of the present invention manufactured by performing the nitrification in the furnace after the RTN are lower than the probabilities (%) of leakage current in the conventional capacitors (expressed by □ and Δ) manufactured only by performing the RTN.

As apparent from the above description, the present invention provides a method for manufacturing a capacitor having $Al_2O_3$ and $HfO_2$ dielectric films of a semiconductor element, in which RTN is performed on the surface of a bottom electrode, and a rapid thermal process in a furnace under a nitride atmosphere is performed before dielectric films are deposited on the bottom electrode so that stress, applied to a semiconductor substrate by the RTN, is alleviated, thereby obtaining a high capacitance and lowering the leakage current.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a capacitor of a semiconductor element comprising:
   forming a bottom electrode of the capacitor over a semiconductor substrate;
   treating the upper surface of the bottom electrode by rapid thermal nitrification (RTN) over the upper surface of the bottom electrode;
   performing a thermal process on the bottom electrode in a furnace with a nitrogen-containing atmosphere;
   forming $Al_2O_3$ and $HfO_2$ dielectric films over the bottom electrode; and
   forming a top electrode of the capacitor on the $Al_2O_3$ and $HfO_2$ dielectric films.

2. The method according to claim 1,
   wherein the bottom electrode is made of doped polysilicon, or is obtained by depositing doped polysilicon, and undoped amorphous silicon or low-doped amorphous silicon on the semiconductor substrate in-situ.

3. The method according to claim 2,
   wherein the doped polysilicon of the bottom electrode has a thickness of 50Å~300Å, and the undoped amorphous silicon or low-doped amorphous silicon has a thickness of 100Å~400Å.

4. The method according to claim 2, further comprising forming a meta-stable polysilicon (MSP) structure of the bottom electrode having an irregular silicon thin film by seeding silicon on the undoped silicon of the bottom electrode and annealing the surface of the obtained silicon thin film.

5. The method according to claim 4, further comprising performing ion implantation of a dopant into the bottom electrode having the MSP structure.

6. The method according to claim 5, further comprising removing a natural oxide film by a cleaning step and forming an oxide thin film using a cleaning solution after the ion implantation.

7. The method according to claim 6, further comprising activating the dopant implanted into the bottom electrode through rapid thermal process after the formation of the oxide thin film.

8. The method according to claim 6,
   comprising forming the oxide thin film having a thickness of 0.3 nm–1.5 nm using the cleaning solution having a composition ratio of $NH_4OH:H_2O_2:H_2O=1:4~5:20~50$.

9. The method according to in claim 1,
   comprising treating the RTN at a temperature of 800° C.~900° C. for 30 seconds to 120 seconds.

10. The method according to in claim 1,
    comprising performing the thermal process in the furnace under the nitride atmosphere at a temperature of 700° C.~800° C. under a $N_2$— or $NH_3$— containing atmosphere for 10 seconds to 60 seconds.

11. The method according to claim 1,
    wherein the $Al_2O_3$ dielectric film has a thickness of 15Å~35Å, and the $HfO_2$ dielectric film has a thickness of 10Å~30Å.

12. The method according to claim 1,
    wherein TMA is used as an Al source, $Hf[N(CH_3)_2]_4$, $Hf[N(CH_2CH_3)_2]_4$, or $Hf[N(CH_2CH_3)(CH_3)]_4$ is used as a Hf source, and $O_3$ or $HfO_2$ is used as an $O_2$ source in the $Al_2O_3$ and $HfO_2$ dielectric films.

13. The method according to claim 1, comprising forming the $Al_2O_3$ and $HfO_2$ dielectric films by atomic layer deposition (ALD).

14. The method according to claim 1, further comprising thermally treating the $Al_2O_3$ and $HfO_2$ dielectric films in the furnace at a temperature of 550° C.~700° C. under a $N_2$ atmosphere after the formation of the $Al_2O_3$ and $HfO_2$ dielectric films.

15. The method according to claim 1, wherein the top electrode is made of one member selected from the group consisting of doped polysilicon, doped polysilicon and a metal film, and silicon germanium and metal film.

* * * * *